(12) United States Patent
McGowan et al.

(10) Patent No.: US 6,507,489 B1
(45) Date of Patent: Jan. 14, 2003

(54) TOGGLE HEAT SINK CLIP

(75) Inventors: Matthew McGowan, Austin, TX (US); Mark W. Foohey, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/921,379

(22) Filed: Aug. 2, 2001

(51) Int. Cl.$^7$ ................................................. H05K 7/20
(52) U.S. Cl. ........................ 361/687; 361/704; 361/710; 257/707; 165/80.3
(58) Field of Search ......................... 361/687, 704–711, 361/717, 719, 722; 24/295, 457, 458, 493–498, 505, 510, 513, 517–518, 535–538; 411/352, 516, 520, 522; 174/16.3; 257/706–727; 165/80.2, 80.3, 80.4, 185; 248/316.7, 505, 510

(56) References Cited

U.S. PATENT DOCUMENTS

| 5,331,507 A | | 7/1994 | Kyung et al. | |
| 5,448,449 A | | 9/1995 | Bright et al. | |
| 5,600,540 A | | 2/1997 | Blomquist | |
| 5,638,258 A | * | 6/1997 | Lin | 361/704 |
| 5,791,403 A | * | 8/1998 | Chiou | 165/80.3 |

* cited by examiner

*Primary Examiner*—Gerald Tolin
*Assistant Examiner*—Michael Datskovsky
(74) *Attorney, Agent, or Firm*—Haynes and Boone, LLP

(57) ABSTRACT

A toggle heat sink clip assembly includes a support base having a first end and a second end opposite the first end. A spring member has a first end and a second end, the first end of the spring member being pivotally attached to the first end of the support base. A rigid handle has a first end and a second end, the first end of the handle being pivotally attached to the second end of the support base. A rigid pivot member has a first end and a second end, the first end of the pivot member being pivotally attached to the second end of the spring member, and the second end of the pivot member being pivotally attached to a mid portion of the handle. The clip is movable to a locked position whereby a heat sink is retained in secured engagement with a microprocessor in a computer chassis.

22 Claims, 6 Drawing Sheets

TOGGLE HEAT SINK CLIP

BACKGROUND

The disclosures herein relate generally to computer systems and more particularly to a toggle clip for securing a heat sink in a computer chassis.

Increased processor power has demanded heavier heat sinks and stronger heat sink clips. Presently used clips require a large amount of force to open and close. In addition, if a clip is incorrectly installed, damage to the motherboard may result.

The use of higher force clips causes ergonomic issues for manufacturing personnel. As a result, an installation tool may be needed to supply a needed mechanical advantage. This can create a problem for field service repair needing the tool for removal and replacement.

One present clip is disclosed in U.S. Pat. No. 5,448,449. This particular clip includes a pair of spaced apart beams. Another well-known clip is described in U.S. Pat. No. 5,600,540 and is used in several products currently on the market. This particular clip includes a simple beam spring with no mechanical advantage. A downward force is imposed on the heat sink by pushing on a handle. The downward force is only slightly greater than the force required to push the clip over the retention tabs. An installation tool is required for assembly and for field service.

Therefore, what is needed is a heat sink clip that does not require a high force for installation but provides a sufficient force for retaining heavy heat sinks in place on the motherboard.

SUMMARY

One embodiment, accordingly, provides a sufficient holding force without the need for an installation tool, and also reduces the possibility for incorrect installation. To this end, a toggle heat sink clip includes a spring member, a rigid handle, and a rigid pivot member having a first end pivotally connected to the spring member and a second end pivotally connected to the handle.

A principal advantage of this embodiment is that the toggle clip uses a mechanical advantage to create a high amount of downward holding force on the heat sink while requiring minimal installation force. A preload ensures proper placement before actuating the clip from an open (unlocked) position to a closed (locked) position. This reduces the chances of incorrect installation.

DETAILED DESCRIPTION

Figure 1:
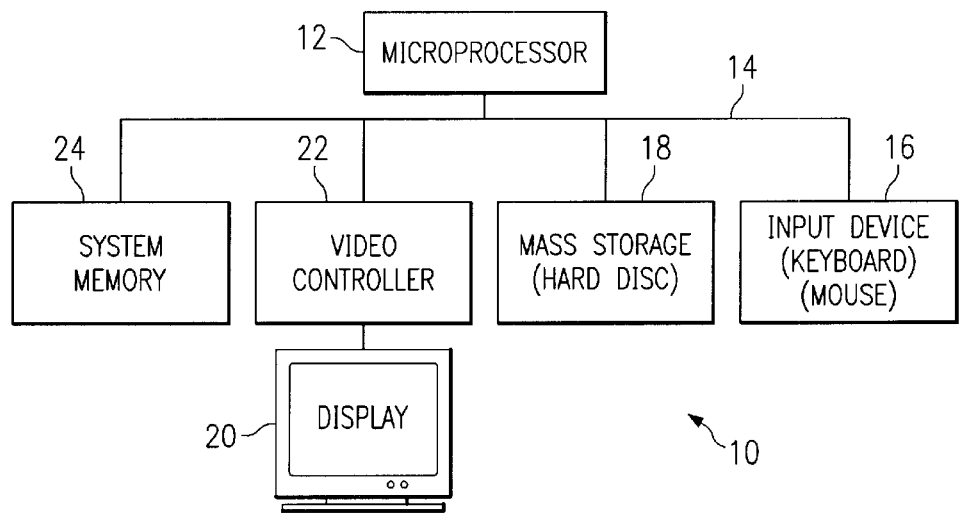
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input system 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
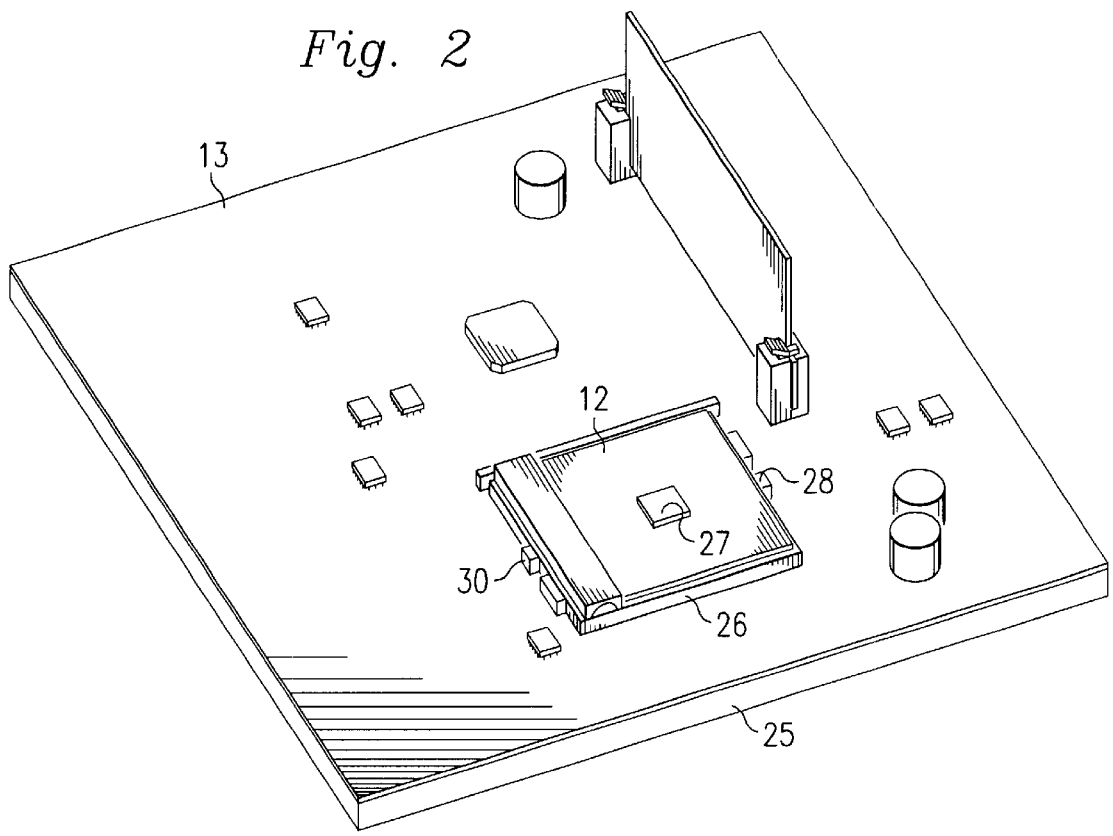
FIG. 2 is a view illustrating an embodiment of a microprocessor mounted on a support base seated in a computer chassis.

A chassis 25, FIG. 2, supports several of the components of computer system 10. In addition, a motherboard 13 is mounted in chassis 25 and a support base 26 is mounted on and electrically connected to the motherboard 13. Microprocessor 12 is mounted on the support base 26. A die 27 is a raised portion of the microprocessor 12 through which heat generated by the microprocessor 12 is concentrated for contact with a heat sink, or the like (discussed below). The support base 26 includes a support base first end 28 and a support base second end 30.

Figure 3:
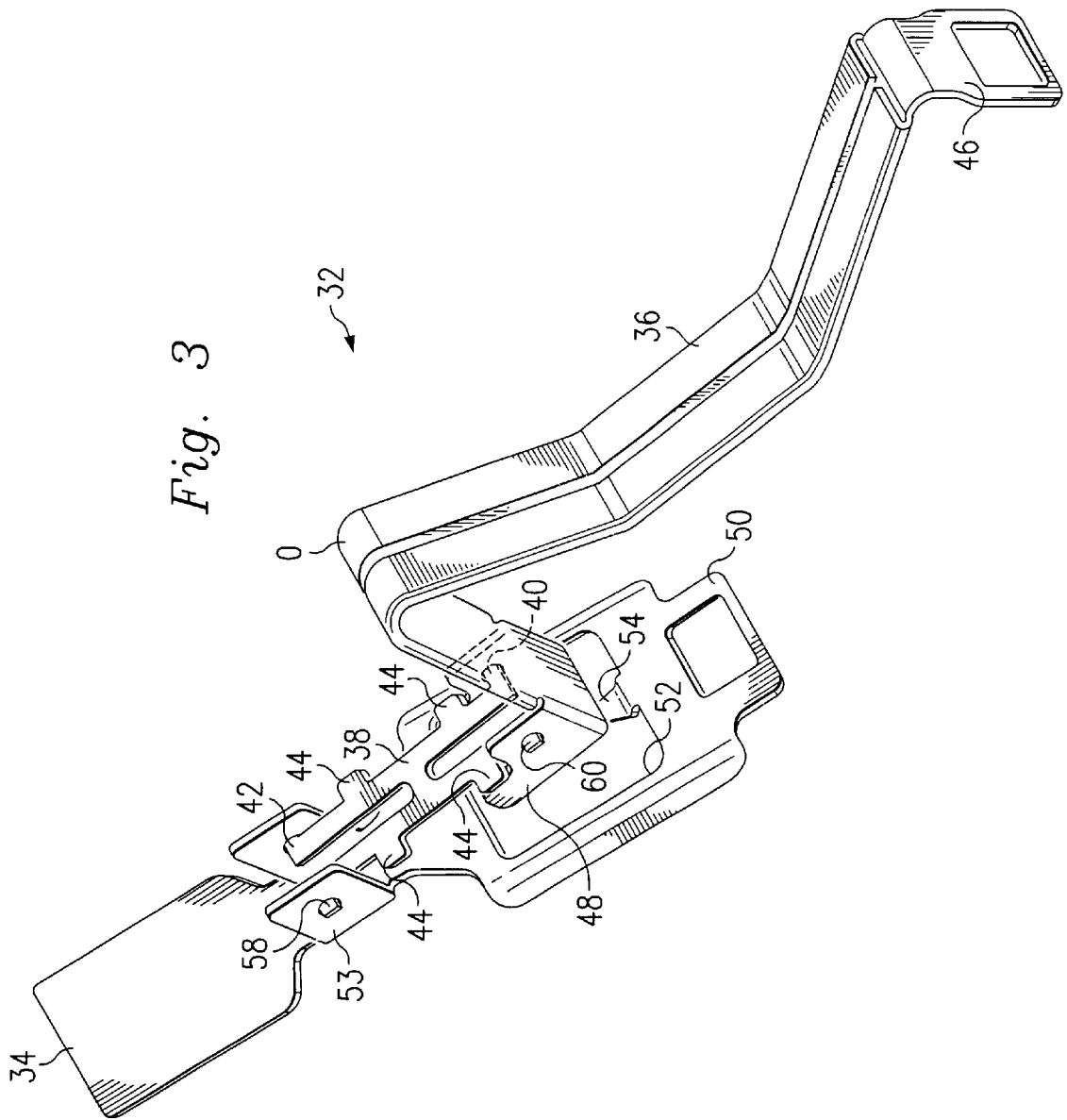
FIG. 3 is a perspective view of an embodiment of a toggle heat sink clip.

A heat sink clip 32, FIG. 3, is comprised of a handle 34 and a spring member 36 interconnected by a pivot member 38. Pivot member 38 has a pivot member first end 40 pivotally connected to a spring member bracket 48 (creating a low pivot point 60) and a pivot member second end 42 pivotally connected to a handle bracket 53 (creating an upper pivot point 58). Pivot member 38 also includes a pivot member stop 44 adjacent each end 40, 42. Pivot member 38 is symmetrically structured to allow the assembly of the heat sink clip 32 to be independent of the orientation of pivot member 38. Spring member 36 includes a spring member first catch 46 and the spring member bracket 48. Handle 34 includes a handle second catch 50 and a handle opening 52 with a handle stop 54 extending into handle opening 52.

Figure 4:
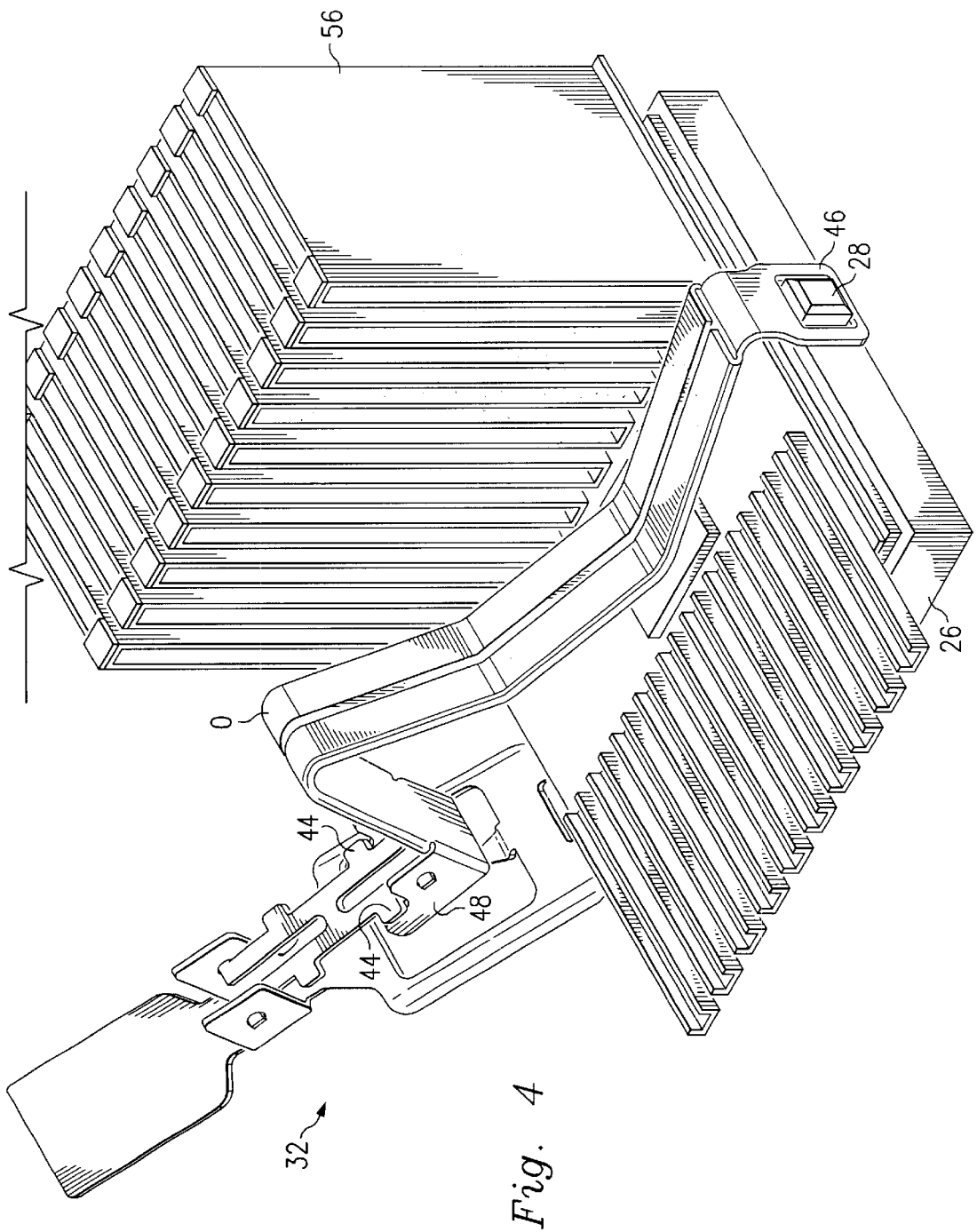
FIG. 4 is a view illustrating the clip of FIG. 3 attached to the front end of the support base.
Figure 5:
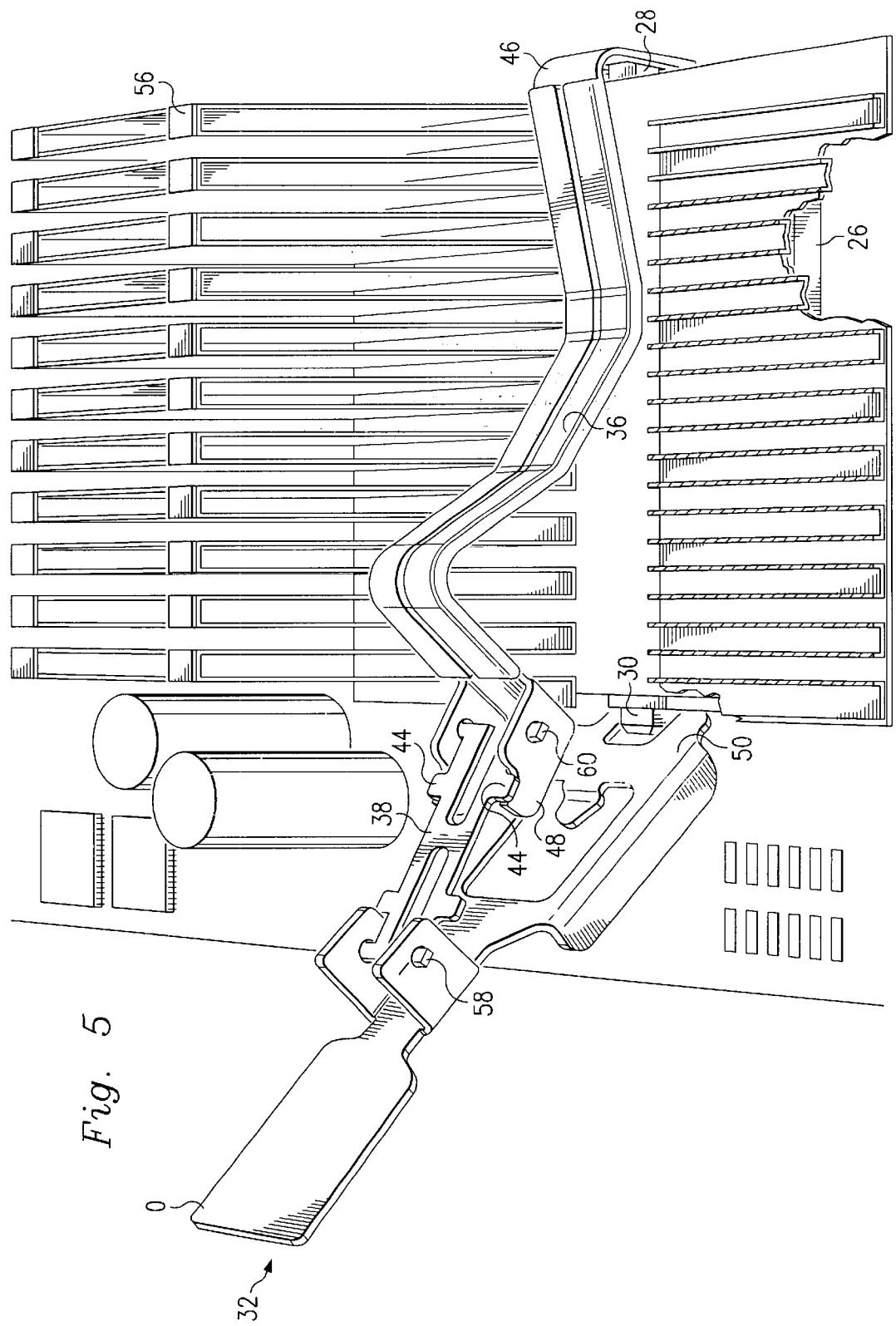
FIG. 5 is a view illustrating a heat sink sitting on the support base with the clip attached to the support base in the open position.

FIG. 4 is a view of a heat sink 56 mounted on support base 26. Heat sink clip 32 is in an open position O with spring member first catch 46 attached to support base first end 28. FIG. 5 is another view of heat sink 56 mounted on support base 26. Heat sink clip 32 is in the open position O with handle second catch 50 attached to support base second end 30. By hooking first catch 46 under support base first end 28 (FIG. 4) and second catch 50 under support base second end 30 (FIG. 5), the geometry of the clip 32 provides a slight preload that allows the clip 32 to stay in place before a full load is applied. This helps to limit the possibility of incorrect installation, as the full load cannot be applied until the correct placement of the clip 32 on the support base 26 is achieved. The preload is only slight and unlikely to damage support base first end 28 or support base second end 30. Both the FIG. 4 and FIG. 5 views illustrate how, when in the open position, pivot member stop 44 engages with spring member bracket 48 to stop further rotation around the lower pivotal connection point 60 and holds the clip 32 in a first or open position O.

Figure 6:
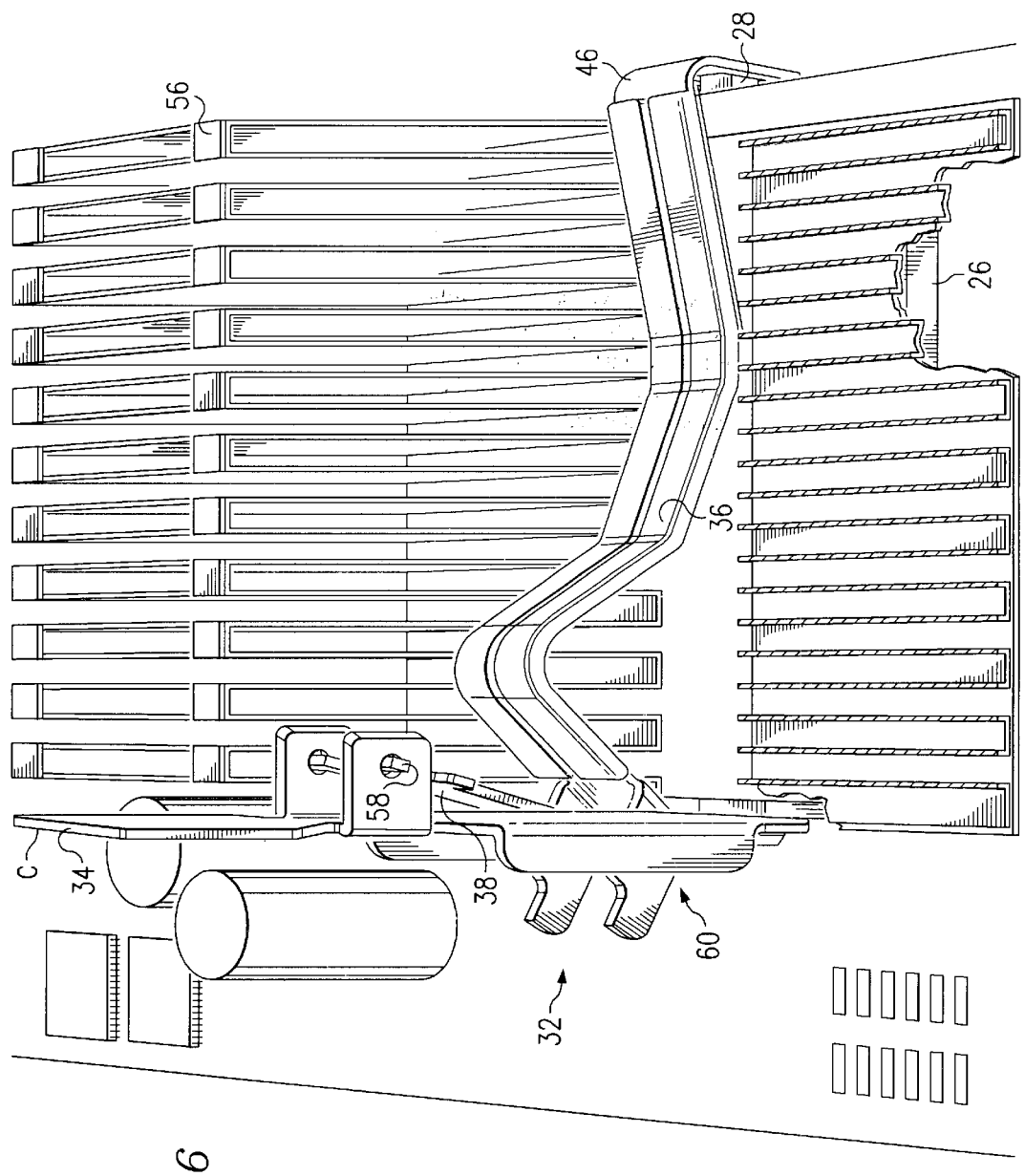
FIG. 6 is a view illustrating the clip connected to the support base in the closed position.
Figure 7:
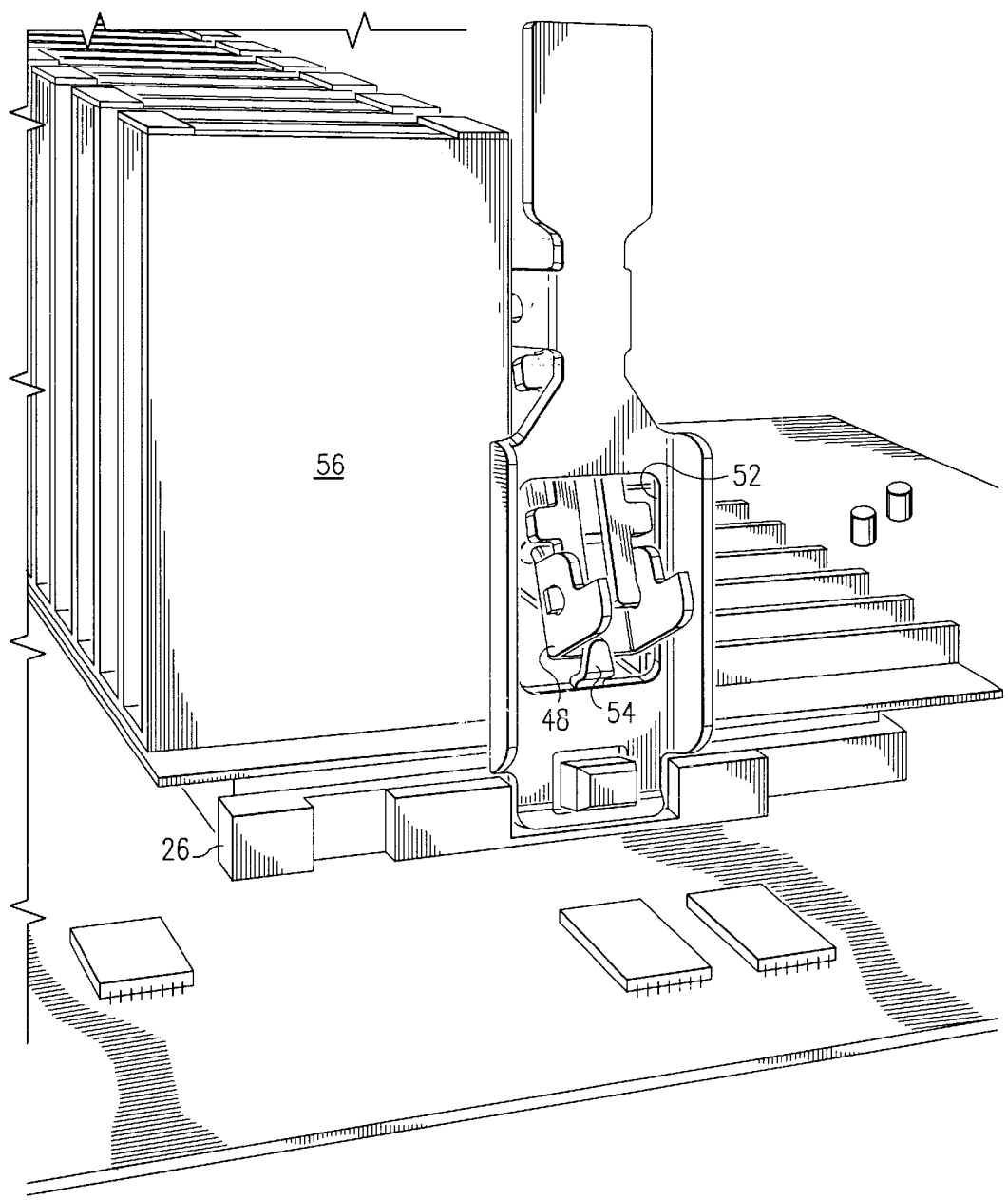
FIG. 7 is a view illustrating the clip in the closed position.

FIG. 6 is a further view of heat sink 56 mounted on support base 26. Heat sink clip 32 is in a second or closed position C. When force is applied to handle 34, handle 34 acts as a lever. As handle 34 rotates from first position O, FIG. 5, to second position C, FIG. 6, it causes pivot member 38 to transfer a downward force on spring member 36. In turn, spring member 36 transfers a downward force on heat sink 56 that is much greater than the original force applied to handle 34. Heat sink clip 32 locks in place by having the upper pivot point 58 extend over the lower pivot point 60 with spring member bracket 48 extending through handle opening 52 and against handle stop 54, FIG. 7, creating an over center retention.

As can be seen, the principal advantages of these embodiments are that a toggle heat sink clip uses a mechanical advantage of both a lever and a linkage to create a large amount of downward force on the heat sink but only requires a small amount of installation force. The latch has a large arm that acts as a lever. As the arm is actuated, the linkage pushes down on the spring. The way the clip locks is by having the upper pivot point extend over the lower pivot point, creating an over center retention.

To limit incorrect installation, a slight preload is included in the geometry of the clip. You must first hook the latch over the retention tab so that the clip is slightly loaded to a point where it will stay in place before the full load is applied. This preload is only slight and not enough to damage the retention tab. The full load cannot be applied until the correct placement of the clip on the retention tab is achieved.

The metal toggle heat sink clip does not require the use of a tool. A long time desire has been to get away from hardware that requires tools for installation and service. The prior heat sink clip design was always an application which required tools, due to its high force. Due to a low installation force needed to operate the present toggle clip, no tools are necessary.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A toggle heat sink clip comprising:
   a spring member;
   a rigid handle; and
   a rigid pivot member having a first end pivotally connected to the spring member and a second end pivotally connected to the handle.

2. The clip as defined in claim 1 wherein the spring member includes a first end having a first catch and a second end having a bracket.

3. The clip as defined in claim 2 wherein the pivot member is connected to the bracket.

4. The clip as defined in claim 3 wherein the pivot member includes a stop for engagement with the bracket.

5. The clip as defined in claim 2 wherein the handle includes first end having a catch.

6. The clip as defined in claim 5 wherein the handle includes an opening formed therein adjacent the catch.

7. The clip as defined in claim 6 wherein the handle includes a stop extending into the opening for engagement with the bracket.

8. The clip as defined in claim 1 wherein the first end of the pivot member includes a first stop and the handle includes a second stop.

9. The clip as defined in claim 8 wherein the clip is movable between a locked position and an unlocked position, whereby the first stop engages the spring member in the unlocked position and the second stop engages the spring member in the locked position.

10. A toggle heat sink clip assembly comprising:
    a support base having a first end and a second end opposite the first end;
    a spring member having a first end and a second end, the first end of the spring member being pivotally attached to the first end of the support base;
    a rigid handle having a first end and a second end, the first end of the handle being pivotally attached to the second end of the support base; and
    a rigid pivot member having a first end and a second end, the first end of the pivot member being pivotally attached to the second end of the spring member, and the second end of the pivot member being pivotally attached to a mid portion of the handle.

11. The clip as defined in claim 10 wherein the spring member includes a first end having a first catch and a second end having a bracket.

12. The clip as defined in claim 11 wherein the pivot member is connected to the bracket.

13. The clip as defined in claim 12 wherein the pivot member includes a stop for engagement with the bracket.

14. The clip as defined in claim 11 wherein the first end of the handle includes a catch.

15. The clip as defined in claim 14 wherein the handle includes an opening formed therein adjacent the catch.

16. The clip as defined in claim 15 wherein the handle includes a stop extending into the opening for engagement with the bracket.

17. The clip as defined in claim 10 wherein the first end of the pivot member includes a first stop and the handle includes a second stop.

18. The clip as defined in claim 17 wherein the clip is movable between a locked position and an unlocked position, whereby the first stop engages the spring member in the unlocked position and the second stop engages the spring member in the locked position.

19. A computer system comprising:
    a chassis;
    a microprocessor mounted in the chassis;
    a storage coupled to the microprocessor;
    a video controller coupled to the microprocessor;
    a memory coupled to provide storage to facilitate execution of computer programs by the microprocessor;
    a support base supporting the microprocessor and having a first end and a second end opposite the first end;
    a spring member having a first end and a second end, the first end of the spring member being pivotally attached to the first end of the support base;
    a rigid handle having a first end and a second end, the first end of the handle being pivotally attached to the second end of the support base;
    a rigid pivot member having a first end and a second end, the first end of the pivot member being pivotally attached to the second end of the spring member, and the second end of the pivot member being pivotally attached to a mid portion of the handle.

20. The system as defined in claim 19 wherein the first end of the pivot member includes a first stop and the handle includes a second stop.

21. The system as defined in claim 20 wherein the handle is movable between a locked position and an unlocked position, whereby the first stop engages the spring member in the unlocked position and the second stop engages the spring member in the locked position.

22. The system as defined in claim 21 further comprising:

a heat sink mounted on the microprocessor; and the spring member engaging the heat sink and retaining the heat sink on the microprocessor in response to the handle being in the locked position.

* * * * *